United States Patent
Dagner et al.

(10) Patent No.: US 9,764,379 B2
(45) Date of Patent: Sep. 19, 2017

(54) MODELLING OF A CAST ROLLING DEVICE

(71) Applicant: SIEMENS AKTIENGESELLSCHAFT, Munich (DE)

(72) Inventors: Johannes Dagner, Erlangen (DE); Thomas Matschullat, Eckental (DE); Guenther Winter, Neunkirchen/Brand (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 260 days.

(21) Appl. No.: 14/382,129

(22) PCT Filed: Mar. 1, 2013

(86) PCT No.: PCT/EP2013/054129
§ 371 (c)(1),
(2) Date: Aug. 29, 2014

(87) PCT Pub. No.: WO2013/127982
PCT Pub. Date: Sep. 6, 2013

(65) Prior Publication Data
US 2015/0096712 A1  Apr. 9, 2015

(30) Foreign Application Priority Data
Mar. 1, 2012  (EP) ..................... 12157728

(51) Int. Cl.
*B22D 11/06* (2006.01)
*B22D 11/16* (2006.01)
(Continued)

(52) U.S. Cl.
CPC .............. *B22D 11/16* (2013.01); *B22D 11/06* (2013.01); *B22D 11/0608* (2013.01);
(Continued)

(58) Field of Classification Search
CPC . B22D 11/06; B22D 11/0608; B22D 11/0622; B22D 11/0634; B22D 11/16; B22D 11/188; B22D 11/22
(Continued)

(56) References Cited

U.S. PATENT DOCUMENTS 5,787,967 A   8/1998   Vendeville et al.
6,085,183 A   7/2000   Horn et al.
(Continued)

FOREIGN PATENT DOCUMENTS

CN   1178016   4/1998
CN   1596163   3/2005
(Continued)

OTHER PUBLICATIONS

Chinese Office Action for related Chinese Patent Application No. 2013800118721, issued Jul. 3, 2015, 12 pages.
(Continued)

*Primary Examiner* — Kevin P Kerns
(74) *Attorney, Agent, or Firm* — Slayden Grubert Beard PLLC

(57) ABSTRACT

A computer determines a thickness and/or a temperature of a metal strip. The computer determines the temperatures occurring along a respective rotation part of the respective surface elements of the rotary elements and a rotary element shape which forms in the region of a draw-off point on the respective surface element, by a respective rotary element model and using an exchanged enthalpy quantity, the respective contact time with a metal and a respective cycle time exchanged per time unit of a respective rotary element of a casting device with the environment thereof. The temperature of the metal situated in the die region, and the heat flow from the metal to the respective surface element, are determined by a respective metallurgical solidification model and
(Continued)

using a metal temperature, the temperatures of the surface elements, the rotary element shape and characteristic metal values.

11 Claims, 6 Drawing Sheets

(51) Int. Cl.
    *B22D 11/18* (2006.01)
    *B22D 11/22* (2006.01)
    *G06F 17/50* (2006.01)

(52) U.S. Cl.
    CPC ...... *B22D 11/0622* (2013.01); *B22D 11/0634* (2013.01); *B22D 11/188* (2013.01); *B22D 11/22* (2013.01); *G06F 17/50* (2013.01)

(58) Field of Classification Search
    USPC .................................................. 164/427, 452
    See application file for complete search history.

(56) References Cited

U.S. PATENT DOCUMENTS

| | | | |
|---|---|---|---|
| 6,588,493 | B1 | 7/2003 | Bleide et al. |
| 7,044,193 | B2 | 5/2006 | Etzelsdorfer et al. |
| 7,449,140 | B2 | 11/2008 | Franz et al. |
| 8,601,851 | B2 | 12/2013 | Seidel et al. |
| 2003/0116301 | A1 | 6/2003 | Bleide et al. |
| 2004/0216861 | A1 | 11/2004 | Etzelsdorfer et al. |
| 2005/0016712 | A1 | 1/2005 | Franz et al. |
| 2009/0320546 | A1 | 12/2009 | Seidel et al. |

FOREIGN PATENT DOCUMENTS

| | | |
|---|---|---|
| CN | 1685293 | 10/2005 |
| CN | 1979496 | 6/2007 |
| CN | 101745612 | 6/2010 |
| CN | 102149492 | 8/2011 |
| DE | 195 08 474 A1 | 9/1996 |
| DE | 102006002505 | 5/2007 |
| EP | 0 736 350 A1 | 10/1996 |
| EP | 12157728 | 3/2012 |
| TW | 200301167 | 7/2003 |
| WO | WO 01/91943 A1 | 12/2001 |
| WO | WO 03/045607 A2 | 6/2003 |
| WO | PCT/EP2013/054129 | 3/2013 |

OTHER PUBLICATIONS

European Search Report mailed Aug. 2, 2012 for corresponding European Patent Application No. 12157728.2.
International Search Report mailed Jun. 12, 2013 for corresponding International Patent Application No. PCT/EP2013/054129.

MODELLING OF A CAST ROLLING DEVICE

CROSS REFERENCE TO RELATED APPLICATIONS

This application is based on and hereby claims priority to International Application No. PCT/EP2013/054129 filed on Mar. 1, 2013 and European Application No. 12157728.2 filed on Mar. 1, 2012, the contents of which are hereby incorporated by reference.

BACKGROUND

The present invention relates to a method of determining the thickness and/or the temperature of a metal strip having a strip width and cast by a casting device,
  wherein the casting device has a die region into which is poured metal having a metal temperature that is greater than the solidus temperature of the metal,
  wherein the casting device has a number of rotary elements delimiting the die region on one side in each case,
  wherein each rotary element has surface elements which move cyclically along a respective rotation path at a respective rotational speed,
  wherein
    the surface elements of the respective rotary element are immersed at a respective immersion point into the metal located in the die region,
    during the further onward movement of the surface elements the metal solidifies on the immersed surface elements to form a respective strand shell,
    the surface elements terminate contact with the respective strand shell at a draw-off point,
    the metal strip is withdrawn from the die region at the draw-off point, and
    the strand shells are constituent parts of the metal strip,
  wherein the surface elements of the respective rotary element
    require a respective cycle time for a complete revolution along the respective rotation path and
    require a respective contact time for the onward movement from the respective immersion point to the respective draw-off point,
  wherein in addition to an enthalpy supply effected by the metal located in the die region the rotary elements exchange a respective enthalpy quantity with their environment per time unit.

The present invention also relates to a computer program comprising machine code which can be processed directly by a computer and the processing of which by the computer causes the computer to perform a determination method of said type.

The present invention additionally relates to a computer programmed with a computer program of said type.

The present invention furthermore relates to a casting device for casting a metal strip having a strip width,
  wherein the casting device has a die region into which is poured metal having a metal temperature that is greater than the solidus temperature of the metal,
  wherein the casting device has a number of rotary elements delimiting the die region on one side in each case,
  wherein each rotary element has surface elements which move cyclically along a respective rotation path at a respective rotational speed,
  wherein the surface elements of the respective rotary element are immersed at a respective immersion point into the metal located in the die region and the metal strip is withdrawn from the die region at a draw-off point,
  wherein the casting device is assigned a computer of said type.

EP 0 736 350 B1 discloses a twin-roll casting device in which the profile of the cast strip is registered and a local heat flow coefficient is correctively adjusted in order to approximate the cast profile to a desired profile. A model is also used to determine the resulting curvature on the basis of the heat flow through the casting rolls. The heat flow through the roll is determined on the basis of the volume of coolant flowing through the roll and the temperature difference thereof.

WO 03/045 607 A2 discloses a twin-roll casting device in which a model-based calculation is carried out in order to adjust the structure and influence the profile of the metal strip.

With both approaches it is necessary to equip the casting device with an extensive system of sensors which is all the more susceptible to failure, the closer the sensors are arranged to the castable metal or to the cast strand that is still at casting temperature.

It is of course possible to arrange the sensors at a greater distance away. In this case, however, there is an increase in the dead time that elapses until the effect of a control intervention can be detected by the sensor system.

SUMMARY

One possible object is to provide possible ways by which the temperature and/or the thickness of the cast metal strip can be predicted without significant delays, without the necessity for sensors that are exposed to the harsh conditions—in particular the high temperatures—of the casting operation.

The inventors propose a determination method of the type cited in the introduction in such a way
  that a computer is supplied with
    the quantity of metal poured into the die region per time unit and the metal temperature,
    characteristic values specifying the metal as such, and, per rotary element, the respective cycle time, the respective contact time and the enthalpy quantity exchanged per time unit by the respective rotary element with its environment,
  that the computer implements a casting model of the casting device,
  that the casting model comprises a strip formation model, as well as a respective rotary element model and a respective metallurgical solidification model for each rotary element,
  that the computer makes use of the respective rotary element model to determine, on the basis of
    the enthalpy supply effected per time unit by the metal located in the die region,
    the enthalpy quantity exchanged per time unit by the respective rotary element with its environment,
    the respective cycle time, and
    the respective contact time,
  temperatures of the respective surface element resulting in each case along the respective rotation path and a rotary element shape forming on the respective surface element in the vicinity of the draw-off point, that the computer makes use of the respective metallurgical solidification model to determine, on the basis of
the metal temperature,
the temperature of the respective surface element resulting along the respective rotation path,
the respective rotary element shape forming in the vicinity of the draw-off point, and
the characteristic values specifying the metal as such,
using a respective heat transfer model modeling the heat transfer from the die region into the respective surface element in each case,
the temperature of the metal located in the die region and adjoining the respective surface element, and
the heat flow from the metal adjoining the respective surface element into the respective surface element, and therefrom, in conjunction with the rotational speed of the surface elements, the respective strand shell thickness forming at the draw-off point,
that the computer makes use of the strip formation model to determine the thickness of the metal strip withdrawn from the die region on the basis of the strand shell thicknesses and the rotary element shapes and/or, for the draw-off point, the temperature of the metal strip at that point on the basis of the temperatures of the metal located in the die region and adjoining the respective surface element,
that the computer makes further use of the determined thickness and/or the determined temperature or makes the same available for further evaluation.

In a preferred embodiment it is provided
that the casting model additionally comprises a bath model,
that the computer makes use of the bath model to determine, on the basis of
the metal temperature,
for each rotary element, the temperatures of the respective surface elements resulting along the respective rotation path,
for each rotary element, the respective rotary element shape forming in the vicinity of the draw-off point,
for each rotary element, the respective enthalpy quantity exchanged per time unit by the respective rotary element with its environment,
the characteristic values specifying the metal as such,
in conjunction with geometric properties of the die region, using the heat transfer model, an at least two-dimensionally spatially resolved metal temperature distribution of the metal as a function of the location in the die region, and
that, using the determined metal temperature distribution of the metal, the computer determines the temperature of the metal located in the die region and adjoining the respective surface element.

By this embodiment the temperature behavior of the metal located in the die region can be modeled more accurately.

Preferably it is provided
that within the scope of the respective rotary element model the computer determines, for the respective rotary element, on the basis of
the enthalpy quantity exchanged per time unit by the respective rotary element with its environment,
the respective cycle time, and
the respective contact time,
a rotary element temperature distribution as a function of the location at least in the circumferential direction and in a depth direction running orthogonally to the surface of the surface elements, and that the computer determines the respective rotary element shape taking into account the rotary element temperature distribution.

By this approach it is possible to determine the respective rotary element shape in a relatively simple manner. In particular it is possible for the computer to determine the respective rotary element shape by integration of the rotary element temperature distribution in the depth direction.

The heat transfer model is preferably embodied as a parameterizable heat transfer model that is spatially resolved at least in the strip width direction. In this case it is possible to determine not only the average thickness of the metal strip, but also its profile. This is of advantage in particular because during the subsequent rolling of the cast metal strip its evenness must be preserved and evenness and profile cannot be influenced independently of one another.

Preferably it is provided
that the actual thickness and/or the actual temperature of the metal strip withdrawn from the die region are measured and
that the heat transfer model is adapted on the basis of a comparison of the measured actual thickness and/or the measured actual temperature with the determined thickness and/or the determined temperature.

By this approach the casting model is adapted better and better over the course of time to the actual conditions.

Preferably it is provided that the computer is supplied with geometric parameters of the casting device as parameters and that the computer takes the geometric parameters supplied to it into account when determining the thickness and/or the temperature of the metal strip. This approach makes the determination method particularly flexible. The difference between parameters and variables such as the contact time or the cycle time, for example, is that parameters are specified to the computer once and are then retained unchanged, while variables can change at any time during ongoing operation.

It is possible to operate the determination method exclusively as a monitor. Preferably, however, it is provided
that the determined thickness and/or the determined temperature are compared with a setpoint thickness and/or a setpoint temperature, and
that at least one correcting variable is determined on the basis of the comparison for a final control device influencing the actual thickness and/or the actual temperature and the final control device is actuated in accordance with the determined correcting variable.

The inventors also propose a computer program of the type cited in the introduction. The computer program is in this case embodied in such a way that the computer performs the proposed determination method.

The inventors additionally propose a computer which is programmed with the proposed computer program.

The inventors furthermore propose a casting device of the type cited in the introduction in which the proposed computer is used.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
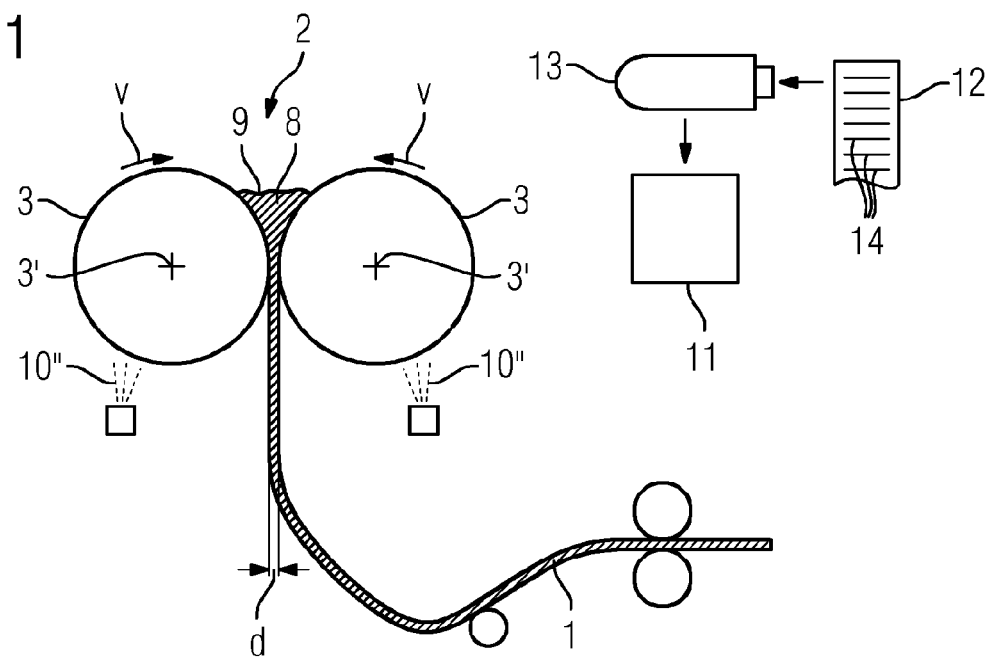
FIG. 1 shows a twin-roll casting machine from the side.

Reference will now be made in detail to the preferred embodiments of the present invention, examples of which are illustrated in the accompanying drawings, wherein like reference numerals refer to like elements throughout.

Figure 2:
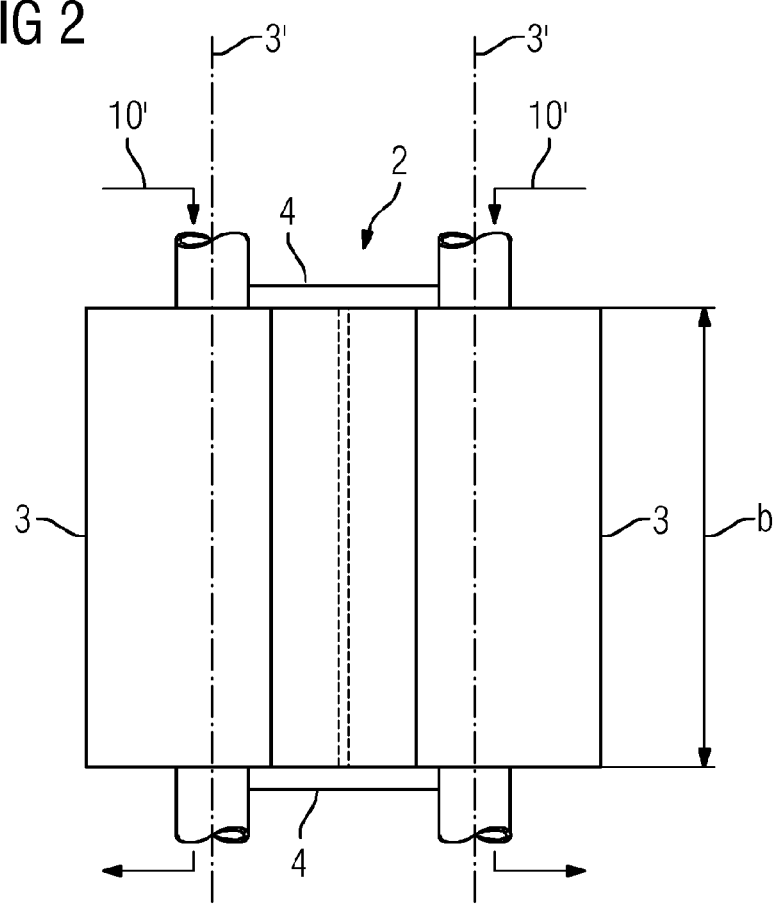
FIG. 2 shows the casting machine of FIG. 1 from above.

According to FIGS. 1 and 2, a casting device for casting a metal strip 1 has a die region 2. According to FIG. 1, the casting device is embodied as a twin-roll casting machine. It therefore has two substantially cylindrical contra-rotating rolls 3 which delimit the die region 2 on two opposing sides. The two other sides of the die region 2 are delimited by side walls 4.

Figure 3:
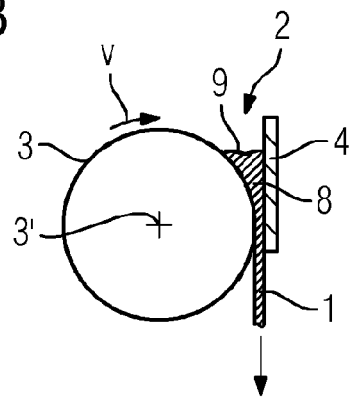
FIG. 3 shows a single-roll casting machine from the side.

Alternatively, the casting device could be embodied according to FIG. 3 as a single-roll casting machine. In this case the casting machine has a single roll 3 which adjoins the die region 2. The three other sides are in this case delimited by the side walls 4.

Figure 4:
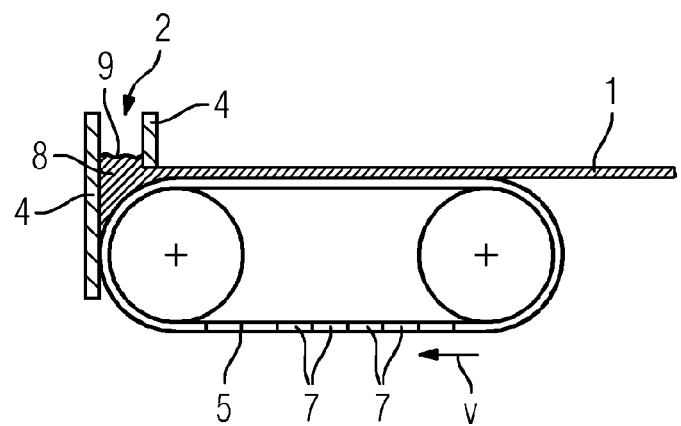
FIG. 4 shows a strip casting machine from the side.

The rolls 3 (or, in the case of the casting machine of FIG. 3, the single roll 3) correspond to rotary elements within the meaning of this document. The rotary elements 3 must not necessarily be embodied in the shape of a roll or cylinder, however, since the casting device could alternatively be embodied according to FIG. 4 as a strip casting machine. In this case the (single) rotary element is embodied as a rotating belt 5, referred to hereinbelow as casting belt 5 to differentiate it linguistically from the metal strip 1. In this embodiment the other sides of the die region 2 are delimited by the side walls 4.

Regardless of its actual physical construction, the casting device therefore has a number (specifically one or two) rotary elements 3, 5, each rotary element 3, 5 delimiting the die region 2 on one side in each case.

Figure 5:
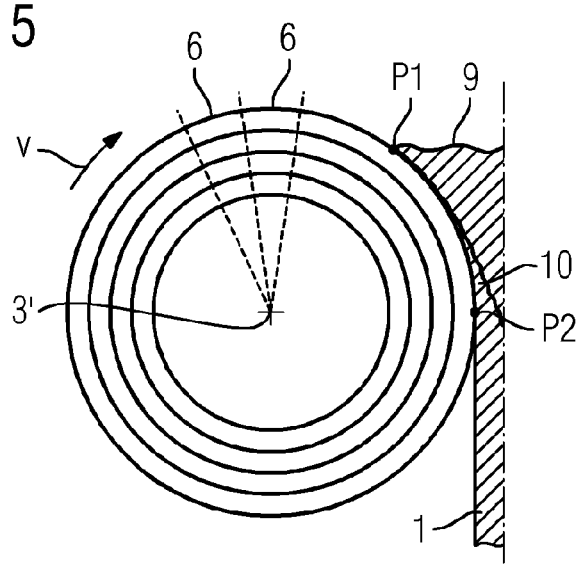
FIG. 5 shows a model representation of a rotary element.

The rotary elements 3, 5 each have a number of surface elements 6. In the case of a casting roll (embodiment according to FIGS. 1, 2 and 3), the surface elements 6 according to FIG. 5 are sections of the respective casting roll 3. In the case of a strip casting machine, the surface elements 6 are the individual elements 7 of the rotating belt 5 (or parts of the individual elements 7). Regardless of the actual design of the casting machine, the surface elements 6 move at a respective rotational speed v cyclically along a respective rotation path. In the case of casting rolls 3, the respective rotational speed v corresponds for example to the product of the angular frequency and the radius of the respective casting roll 3.

A metal 8 having a metal temperature T is cast in the die region 2. The metal 8 can be for example steel, copper, aluminum, brass or a different metal. Regardless of which metal is being cast, however, the metal temperature T lies above the solidus temperature of the corresponding metal 8. The metal 8 is therefore either a pure molten mass or a solid-liquid mixture.

The metal 8 poured into the die region 2 extends in the die region 2 up to a casting meniscus level 9. The surface elements 6 of the rotary elements 3, 5 are immersed at a respective immersion point P1 into the metal 8 located in the die region 2. They then move further within the die region 2 as far as a draw-off point P2. During this onward movement of the surface elements 6 along the die region 2 the metal 8 solidifies on the immersed surface elements 6 to form a respective strand shell 10. When the surface elements 6 reach the draw-off point P2, they terminate contact with the respective strand shell 10. At this point—the draw-off point P2—the metal strip 1 is withdrawn from the die region 2.

The strand shells 10 are constituent parts of the metal strip 1. In the case of a twin-roll casting machine (FIGS. 1 and 2), both strand shells 10 are constituent parts of the cast metal strip 1. They fuse to one another at the (common) draw-off point P2 or in the vicinity thereof. In the case of a single-roll casting machine (FIG. 3) and a strip casting machine (FIG. 4), the single strand shell 10 forms the metal strip 1.

The surface elements 6 rotate, as already mentioned, cyclically along a rotation path specific to the respective rotary element 3, 5. They require a respective cycle time t1 for one revolution. In addition they require a respective contact time t2 for the onward movement from the respective immersion point P1 to the draw-off point P2.

The metal 8 is typically very hot, in the case of steel, for example, in excess of 1200° C., in most cases even above 1500° C. A significant enthalpy quantity is therefore supplied to the rotary elements 3, 5 as a result of the metal 8 being poured into the die region 2. This enthalpy supply E1 must be compensated by cooling. Usually, the casting rolls 3 or, more generally, the rotary elements 3, 5 are cooled internally for this purpose—see FIG. 2—by injection and discharging of a cooling medium 10' (water, for example). It is furthermore possible—in exceptional cases as an alternative to internal cooling, though generally in addition thereto—to provide external cooling of the rotary elements 3, 5 according to FIG. 1, for example using water or—preferably—an inert cryogenic cooling medium 10". The rotary elements 3, 5 also radiate heat into their environment. Finally it may be possible—in quite exceptional cases—to heat the rotary elements 3, 5 from outside.

Irrespective of which enthalpy influences are given, however, in addition to the initially cited enthalpy supply E1 by the metal 8 located in the die region 2, the rotary elements 3, 5 exchange a respective enthalpy quantity E2 with their environment per time unit.

The cast metal strip 1 has a strip width b. The strip width b is specified by the constructive setting of the casting device. The strip width b cannot be changed during the casting process. The cast metal strip 1 also has a thickness d. The thickness d can be influenced. The thickness d—in particular as a function via the strip width b and possibly also as a function via the strip length—constitutes an important target variable of the cast metal strip 1. In an analogous manner the temperature T' of the cast metal strip 1 is also an important target variable which can be influenced.

The thickness d and/or the temperature T' of the metal strip 1 should be determined computationally. A computer 11 is assigned to the casting device for this purpose. The computer is programmed with a computer program 12. The computer program 12 can be supplied to the computer 11 for example by way of a mobile data medium 13 on which the computer program 12 is stored in machine-readable form. The computer program 12 comprises machine code 14 which can be processed directly by the computer 11. The processing of the machine code 14 by the computer 11 causes the computer 11 to perform a determination method for determining the temperature T' and/or the thickness d of the cast metal strip 1, which method is explained in more detail below.

Figure 6:
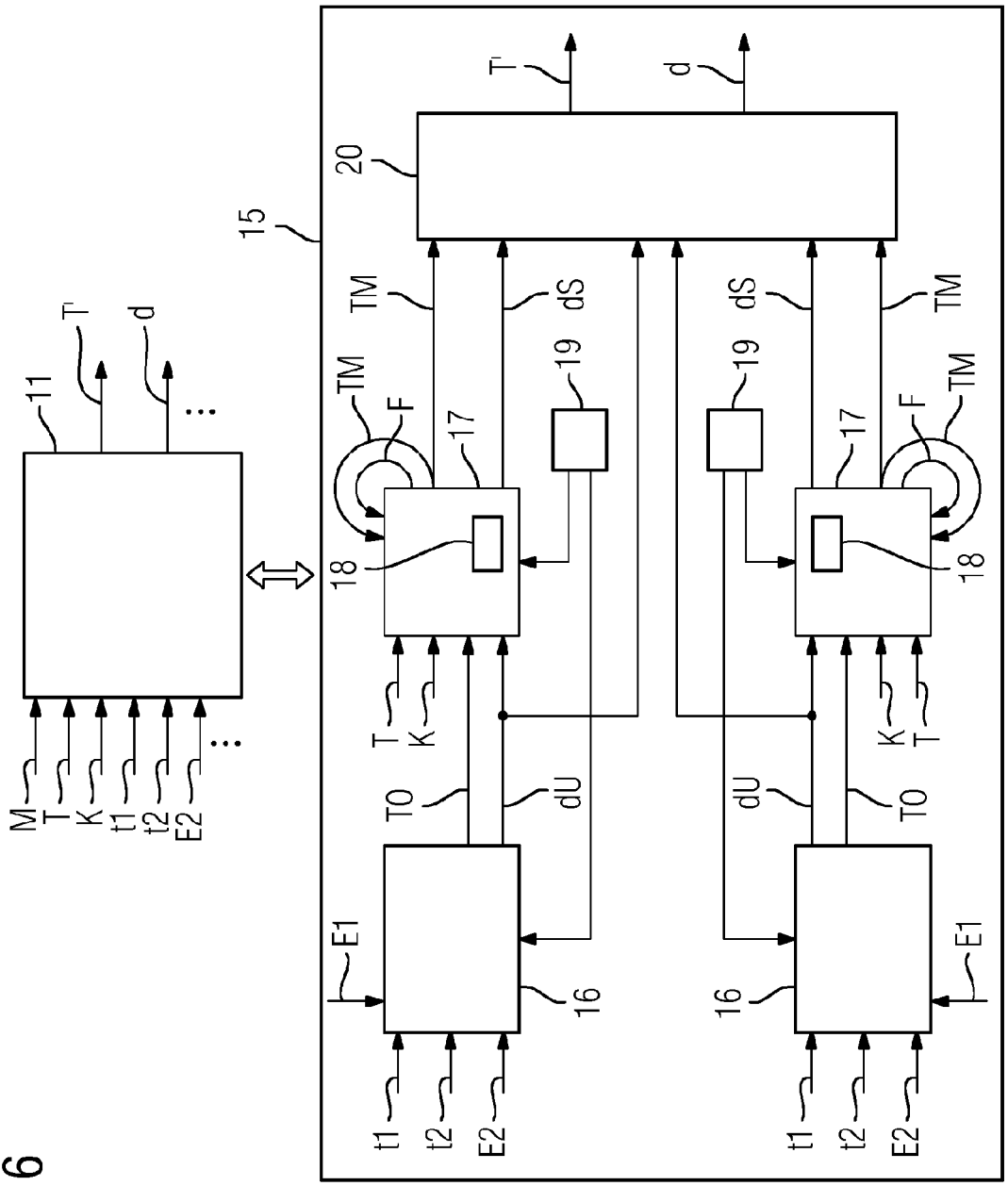
FIG. 6 shows a computing arrangement.

According to FIG. 6, the computer is supplied with a variety of information about the metal 8. This comprises the following variables:

The quantity M of metal 8 which is poured into the die region 2 per time unit.

The temperature T of the metal 8, i.e. the metal temperature T.

Characteristic values K which specify the metal 8 as such. The characteristic values K can include for example the chemical composition of the metal 8, the solidus temperature, the density, the specific enthalpy of fusion, etc.

Information relating to each rotary element 3, 5 is also supplied to the computer 11. This comprises the following variables per rotary element 3, 5:

The cycle time t1, the contact time t2, and the enthalpy quantity E2 exchanged per time unit by the respective rotary element 3, 5 with its environment.

According to FIG. 6, the computer 11 implements a casting model 15 of the casting device. The computer 11 makes use of the casting model 15 to determine the temperature T' and/or the thickness d of the metal strip 1 withdrawn from the die region 2.

According to FIG. 6, the casting model 15 comprises a respective rotary element model 16 for each rotary element 3, 5. If a plurality of such models 16 is present, the rotary element models 16 for the individual rotary elements 3, 5 can be embodied in an identical manner. In any event, however, they must be calculated and possibly also parameterized independently of one another.

The respective rotary element model 16 is supplied with the following variables referred to the corresponding rotary element 3, 5:

The enthalpy supply E1 effected per time unit by the metal located in the die region 2. The computer 11 can determine the enthalpy supply E1 for example on the basis of the quantity M, the temperature T and the characteristic values K of the metal 8.

The enthalpy quantity E2 exchanged per time unit by the respective rotary element 3, 5 with its environment.

The respective cycle time t1, and the respective contact time t2.

On the basis of the cited variables the computer 11 makes use of the respective rotary element model 16 to determine in each case the temperatures TO of the respective surface elements 6 resulting along the respective rotation path as a function of time or—corresponding hereto—as a function of the location on the corresponding rotation path, i.e. along the respective rotation path. The temperatures TO are determined at least for the section from the immersion point P1 to the draw-off point P2, usually even for a complete revolution.

In addition the computer 11 makes use of the respective rotary element model 16 to determine, on the basis of the cited variables E2, t1, t2, a respective rotary element shape dU which forms in the corresponding surface element 6 in the vicinity of the draw-off point P2—optimally—at the draw-off point P2 itself. The computer 11 therefore determines the thermal expansion of the corresponding rotary element 3, 5 in the vicinity of the draw-off point P2. If the rotary element shape dU is determined uniformly via the strip width b, it corresponds to a rotary element thickness. If the rotary element shape is determined in a spatially resolved manner in the strip width direction, it corresponds to a rotary element profile.

Within the scope of the rotary element model 16 the computer 11 usually also makes use of a respective heat transfer model 19 according to the illustration of FIG. 6. The transfer of heat from the die region 2 into the respective surface element 6 is modeled by the respective heat transfer model 19.

The rotary element model 16 or, as the case may be, the rotary element models 16 can be embodied according to requirements. For example, the rotary element model 16 may be based on mathematical-physical equations, in particular on algebraic and/or differential equations. Alternatively it can be a neural network, an empirical model and the like. The rotary element model 16 can be spatially resolved in the strip width direction. The embodiment of the rotary element model 16 is well-known as such to persons skilled in the art.

According to FIG. 6, the casting model 15 additionally comprises a respective metallurgical solidification model 17 for each rotary element 3, 5. The metallurgical solidification models 17—if a plurality of such models is present—can be embodied in an identical manner. They must be calculated and possibly also parameterized independently of one another, however. The metallurgical solidification models 17 can (optionally) include a structure model 18 in addition.

The respective metallurgical solidification model 17 is initially supplied with the variables TO, dU determined by the corresponding rotary element model 16, i.e. the temperatures TO of the corresponding surface elements 6 along the respective rotation path and the rotary element shape dU forming in the vicinity of the draw-off point P2. The respective metallurgical solidification model 17 is additionally supplied with the metal temperature T and the characteristic values K specifying the metal 8 as such.

On the basis of the variables TO, dU, T, K supplied to the respective metallurgical solidification model 17, the computer 11 makes use of the respective metallurgical solidification model 17 to determine in each case the temperature TM of the metal 8 located in the die region 2 and adjoining the respective surface element 6. In addition the computer 11 determines on the basis of the variables TO, dU, T, K supplied to the respective metallurgical solidification model 17 in each case the heat flow F from the metal 8 adjoining the respective surface element 6 into the respective surface element 6. According to FIG. 6, when determining the temperature TM of the metal 8 adjoining the respective surface element 6 and the heat flow F from the metal 8 into the respective surface element 6, the computer 11 uses the respective heat transfer model 19 in addition to the variables TO, dU, T, K supplied to the respective metallurgical solidification model 17.

On the basis of the determined temperature TM of the metal 8 adjoining the respective surface element 6 and of the heat flow F from the die region 2 into the respective surface element 6 in conjunction with the rotational speed v of the surface elements 6, the computer 11 can therefore determine, within the scope of the respective metallurgical solidification model 17, a respective strand shell thickness dS that forms at the draw-off point P2. Furthermore, the temperature TM at the draw-off point P2 is also known on the basis of the temperatures TM.

According to FIG. 6, the casting model 15 additionally includes a strip formation model 20. The strip formation model 20 is supplied with the temperatures TM of the metal 8 located in the die region 2 and adjoining the surface elements 6, the strand shell thicknesses dS and the rotary element shapes dU. The computer 11 makes use of the strip formation model 20 to determine the thickness d and/or the temperature T' of the metal strip 1 withdrawn from the die region 2. The computer 11 evaluates the strand shell thicknesses dS and the rotary element thicknesses dU in order to determine the thickness d of the metal strip 1. The computer 11 determines the temperature T'—for example by averaging at the draw-off point P2—on the basis of the temperatures TM.

Figure 7:
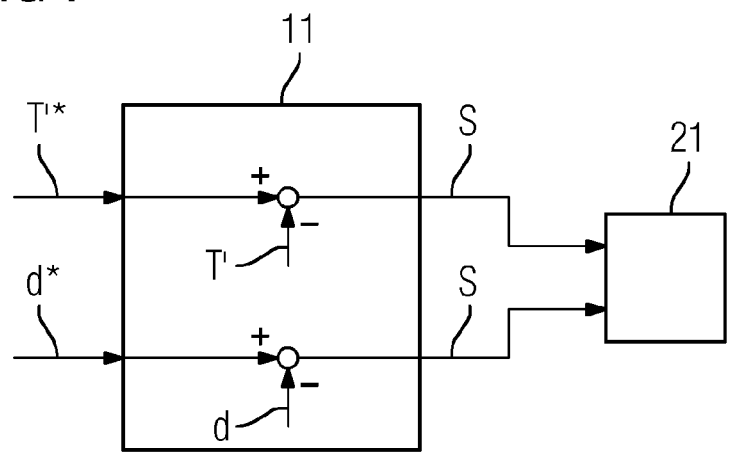
FIG. 7 shows a closed-loop control arrangement.

It is possible for the computer 11 to make the determined thickness d and/or the determined temperature T' of the metal strip 1 available for further evaluation. For example, the computer 11 can output corresponding outputs to an operator (not shown) of the casting device so that the operator will undertake suitable control interventions. Alternatively or in addition it is possible for the computer 11 to make the determined thickness d and/or the determined temperature T' of the metal strip 1 available to another computational device—for example to a control device for the casting device or to a control device for a rolling device positioned downstream of the casting device. Alternatively or in addition it is possible for the computer 11 itself to make further use of the determined thickness d and/or the determined temperature T' of the metal strip 1. In particular the computer 11 can, for example, itself be embodied as a control device for the casting device. In this case, according to FIG. 7, the determined thickness d and/or the determined temperature T' of the metal strip 1 are compared with corresponding setpoints d*, T'*. On the basis of the comparison at least one correcting variable S is determined for a final control device 21. The (actual) thickness dE and/or the (actual) temperature TE of the metal strip 1 can be influenced by the final control device 21. The final control device 21 is therefore actuated in accordance with the determined correcting variable S.

If sensitivities of the final control device 21 are known, i.e. if it is known what change to the correcting variable S will have what effect on the thickness d and/or the temperature T' of the metal strip 1, the correcting variable S can be determined directly. Alternatively it is possible to vary the correcting variable S and to determine once again by the casting model 15 what thickness d and/or what temperature T' the metal strip 1 will then have. In this case a convergence can then be forced for example by a deterministic algorithm. Deterministic algorithms are well-known as such to persons skilled in the art. So-called SQP algorithms and genetic algorithms are cited purely by way of example.

The type of the final control device 21 and the type of the correcting variable S can be determined according to requirements. For example, the symmetric and/or the asymmetric setting of the casting rolls 3 in relation to one another can be utilized as a globally acting correcting variable S. Alternatively or in addition, the rotational speed v and/or the scale of the internal cooling of the casting rolls 3 can be adjusted. Alternatively or in addition, an external cooling device and/or an external heating device, the introduction of heat-conducting gas into depressions in the surface elements 6, a mechanical treatment of the surface elements 6 (brushing, for example) and so forth can be settable as globally or locally acting correcting variables S.

Figure 8:
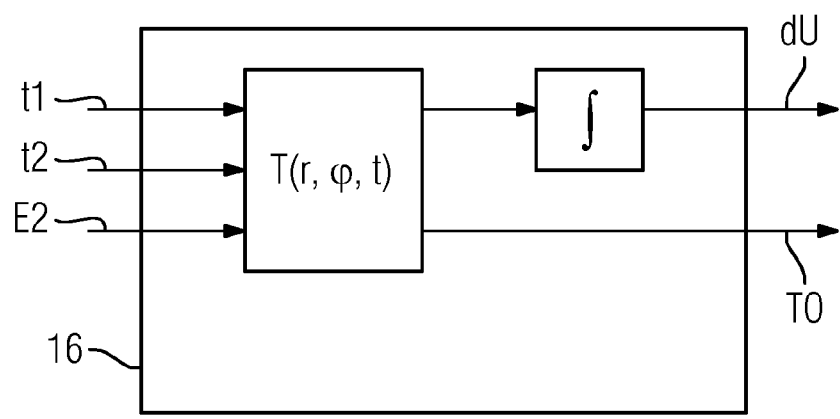
FIG. 8 shows a possible rotary element model.

Various approaches are possible for determining the rotary element shape dU. It is possible according to FIG. 8, for example, that within the scope of the respective rotary element model 16 the computer 11 will determine, on the basis of the enthalpy quantity E2 exchanged per time unit by the respective rotary element 3, 5 with its environment, the respective cycle time t1 and the respective contact time t2, a temperature distribution prevailing within the respective rotary element 3, 5, referred to hereinafter as the rotary element temperature distribution. The rotary element temperature distribution is spatially resolved in at least two variables, specifically in the rotary direction and in a depth direction. The rotary direction, as its name already implies, runs in the direction of the movement of the surface elements 6 of the respective rotary element 3, 5. The depth direction extends orthogonally to the surface of the surface elements 6, i.e. orthogonally to the rotary direction and orthogonally to the strip width direction. Usually the rotary element temperature distribution is additionally temporally resolved.

In the case of a cylindrical casting roll 3 the rotary direction and the depth direction extend tangentially (i.e. around the axis of rotation 3' of the corresponding casting roll 3) and radially (i.e. toward or away from the axis of rotation 3' of the casting roll 3). The strip width direction runs—self-evidently—axially, i.e. parallel to the axis of rotation 3' of the corresponding casting roll 3.

The computer 11 thereupon determines the corresponding rotary element shape dU. Within the scope of determining the rotary element shape dU the computer 11 takes into account the previously determined rotary element temperature distribution. For example, the computer 11 can determine the respective rotary element shape dU by integration of the rotary element temperature distribution in the depth direction. Other approaches are also possible.

The heat transfer model 19 can be embodied in a variety of ways. Thus, for example, it is possible to specify the heat transfer model 19 as a simple linear heat transfer model which estimates the enthalpy flow from the metal 8 located in the die region 2 into the surface elements 6 proportionally to the difference of the temperatures TO of the corresponding surface elements 6 and the temperature TM of the metal 8 located in the die region 2, i.e. the heat transfer coefficient as such is a constant. Preferably, however, the heat transfer coefficient is set within the scope of the heat transfer model 19 as a function of the respective temperature TO of the corresponding surface element 6 and the temperature TM of the metal 8 located in the die region 2. In both cases the heat transfer model 19 can be parameterizable. The difference relates to the fact that in the case of a linear heat transfer model a single coefficient is always present which is parameterized, and that in the case of a nonlinear heat transfer model 19 the number of coefficients can be (but is not necessarily) greater than 1.

It is furthermore possible for the heat transfer model 19 to be uniform, viewed in the strip width direction. Preferably, however, the heat transfer model 19 is spatially resolved in the strip width direction. The spatial resolution is realizable independently of whether the heat transfer model 19 is implemented as a linear or as a nonlinear heat transfer model 19. It is also independent of whether, and, where applicable, to what extent the heat transfer model 19 is parameterizable.

Figure 9:
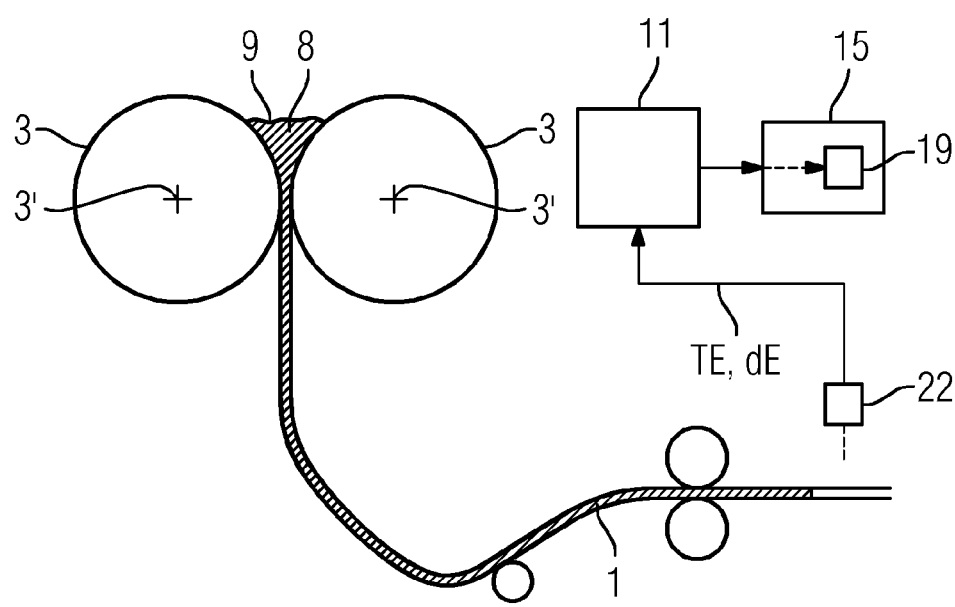
FIG. 9 shows a modification of FIG. 1.

In a preferred embodiment—see FIG. 9—an acquisition device 22 is positioned downstream of the casting device. The actual temperature TE and/or the actual thickness dE of the metal strip 1 are measured by the acquisition device 22. According to FIG. 9, the acquired values dE, TE are supplied to the computer 11. The computer 11 adapts the casting model 15 on the basis of a comparison of the acquired thickness dE and/or the acquired temperature TE of the metal strip 1 with the determined thickness d and/or the determined temperature T' of the metal strip 1. In particular the heat transfer model 19 can be adapted within the casting model 15.

Figure 10:
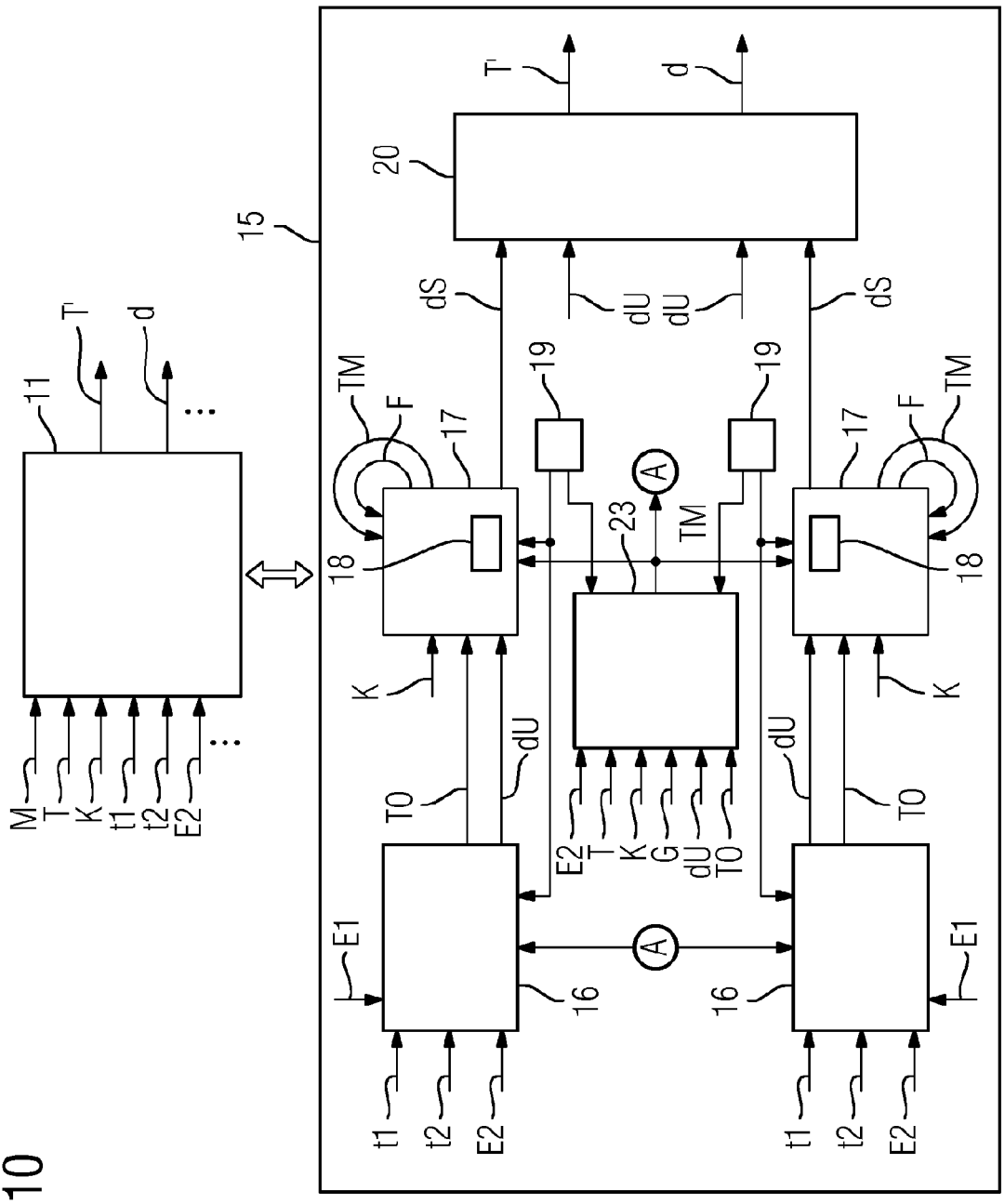
FIG. 10 shows a modification of FIG. 6

In the simplest case the temperature TM of the metal 8 located in the die region is assumed to be constant. This approach by itself leads to acceptable results. Preferably, however, the casting model 15 includes, according to FIG. 10, a bath model 23—in addition to the already mentioned models 16 to 20. The bath model 23 is supplied with the following variables:

- The metal temperature T, i.e. a scalar variable corresponding to the temperature of the metal 8 at a previously known point of the die region 2, for example the temperature of the metal 8 poured into the die region 2.
- The characteristic values K specifying the metal 8 as such.
- The geometric properties G of the die region 2. For example, the diameters of the casting rolls 3 and the distance of their roll axes 3' from one another can be supplied to the bath model 23.
- For each rotary element 3, 5, the respective rotary element shape dU forming in the vicinity of the draw-off point P2.
- For each rotary element 3, 5, the temperatures TO of the respective surface elements 6 resulting along the respective rotation path.
- For each rotary element 3, 5, the respective enthalpy quantity (E2) exchanged per time unit by the respective rotary element (3, 5) with its environment.

On the basis of the predefined variables the computer 11 makes use of the bath model 23 to determine, using the heat transfer model 19, an at least two-dimensionally spatially resolved temperature distribution within the metal 8 located in the die region 2, referred to hereinafter as the metal temperature distribution. The metal temperature distribution is therefore a function of the location in the die region 2. One of the spatial directions in which the metal temperature distribution is spatially resolved is the strip width direction. The other direction is a height-dependent direction. For example, it can be the perpendicular per se. Alternatively it can be the—possibly location-dependent—respective rotary element direction. It is even possible to determine the metal temperature distribution in a three-dimensionally spatially resolved manner, i.e. as a volume distribution in relation to the metal 8 located in the die region 2. Where applicable, even turbulences can be modeled as well.

If the computer 11 makes use of the bath model 23 to determine the metal temperature distribution, the computer 11 determines, within the scope of the respective metallurgical solidification model 17, the temperature TM of the metal 8 located in the die region 2 and adjoining the respective surface elements 6 using the previously determined metal temperature distribution. Reference can also be made to the temperature distribution for determining a distribution of the enthalpy supply E1 in the strip width direction.

It is possible for the geometric parameters G of the casting device—for example the roll diameters of the casting rolls 3 and the strip width b—to be known in advance to the computer 11. Usually, however, the geometric parameters G are supplied to the computer 11 according to the illustration in FIG. 10. In any case, however, the computer 11 takes the geometric parameters into account in determining the thickness d and/or the temperature T' of the metal strip 1.

The proposals can be varied and embodied in a multiplicity of ways. Thus, for example, it is possible to determine the rotary element shape dU in the strip width direction in a spatially resolved manner. This approach is of advantage in particular when not just the (average) thickness of the metal strip 1 is to be determined, but also the profile of the metal strip, i.e. the thickness of the metal strip 1 as a function of the location in the strip width direction. Analogous statements apply to the temperature T' of the metal strip 1.

Furthermore, the thickness d and/or the temperature T' often can be set not only globally (for example via the rotational speed v, via the symmetric or asymmetric setting of the casting rolls 3, via the internal cooling and the level of the casting meniscus 9). In many cases local influencing of the rotary element shape dU and also of the heat transfer coefficient is also possible. In this case the modeling can be performed in a spatially resolved manner in the strip width direction and the profile of the cast metal strip 1 can be set in a targeted manner. Examples of local influences have already been mentioned hereinabove. Such influences include in particular the application of a cooling medium 10" from outside onto the casting rolls 3, where applicable a local heating as well as a brushing of the rotary elements 3, 5, and the local introduction of a heat-conducting inert gas (helium, for example). The spatial resolution in the strip width direction can of course also be performed for other determined variables, such as the rotary element temperature distribution, for example.

The rotary element models 16 can also be embodied in other ways. Thus, for example, it is possible by the respective rotary element model 16 to determine not just changes in temperature or, as the case may be, heat flows F, but also absolute temperatures. In this case, therefore, the heat contents of the rotary elements 3, 5 themselves are determined. This leads to an improved modeling of the rotary elements 3, 5 and their surface elements 6. In particular a transient behavior can be more accurately modeled in this manner. Furthermore, the rotary element models 16 can model the rotary elements 3, 5 completely (i.e. in three spatial dimensions) and where applicable also in time in addition. In the case where the rotary element shape dU is determined in a spatially resolved manner in the strip width direction, the rotary element models 16 can furthermore take into account within the scope of the determination also a residual stress behavior of the corresponding rotary elements 3, 5 as well.

It is furthermore possible with regard to the metal 8 located in the die region 2 not only to differentiate between the solid and liquid phases, but also to determine the extent of a two-phase region (referred to as the mushy zone). This is of significance in particular in the vicinity of the draw-off point P2, since the size of the two-phase region influences the effective strand shell thickness dS and this in turn influences the thickness d of the metal strip 1.

It is also possible to include equipment units positioned downstream of the casting device in the modeling as well. Thus, for example, the casting device can be predictively controlled in such a way that actuator saturation limits of a downstream rolling mill are also taken into account.

The different models—i.e. the rotary element models 16, the metallurgical solidification models 17, the strip formation model 20, as well as, where applicable, the structure model 18 and the bath model 23—can be based on mathematical-physical equations. The equations can be in particular algebraic and/or differential equations. Alternatively the cited models can be neural networks, empirical models and the like. The models can, as already mentioned, be spatially resolved in the strip width direction.

It is possible to perform the determination method online—possibly even in real time. Alternatively it is possible to perform the determination method in advance, for example when a new pouring ladle is to be cast or when process conditions change in other respects, for example the quantity or the temperature of the supplied cooling water 10'.

The proposals have many advantages. In particular there is no necessity for instrumentation comprising sensors which measure the roll crown, the surface temperature, the surface roughness, etc. It is also possible to process measured values and in so doing to bypass dead times.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A method for casting a metal strip with a casting device, wherein the casting device has a die region into which is poured metal having a metal temperature that is greater than a solidus temperature of the metal,
wherein the casting device has at least one rotary element delimiting the die region on one side in each case,
wherein each rotary element has surface elements which move cyclically along a respective rotation path at a respective rotational speed,
wherein the surface elements of each rotary element are immersed at a respective immersion point into metal located in the die region, during further onward movement of the surface elements, the metal solidifies on the surface elements while the surface elements are immersed, to form a respective strand shell, the surface elements terminate contact with the respective strand shell at a draw-off point, the metal strip is withdrawn from the die region at the draw-off point, and the strand shells are constituent parts of the metal strip,
wherein the surface elements of each rotary element require a respective cycle time for a complete revolution along the respective rotation path and require a respective contact time for onward movement from the respective immersion point to the respective draw-off point,
wherein in addition to an enthalpy supply effected per time unit by the metal located in the die region, the rotary elements exchange a respective enthalpy quantity with their environment per time unit, the method comprising:
monitoring a quantity of metal poured into the die region per time unit and the metal temperature of the metal being poured,
ascertaining characteristic values specifying the metal as such, and
for each rotary element, ascertaining the respective cycle time, the respective contact time, and the enthalpy quantity exchanged per time unit by the respective rotary element with its environment;
implementing with a computer a casting model of the casting device, the casting model comprising a strip formation model, as well as a respective rotary element model, and a respective metallurgical solidification model for each rotary element;
calculating by the computer surface element temperatures and rotary element shapes, the surface element temperatures and rotary element shapes determined based at least in part on the respective rotary element model, the surface element temperatures and rotary element shapes determined based on:
the enthalpy supply effected per time unit by the metal located in the die region,
the enthalpy quantity exchanged per time unit by the respective rotary element with its environment,
the respective cycle time, and
the respective contact time,
the surface element temperatures being temperatures of the respective surface elements resulting in each case along the respective rotation path,
the rotary element shapes being shapes formed on the respective surface elements in a vicinity of the draw-off point;
calculating with the computer a die metal temperature, a heat flow, and a strand shell thickness, the die metal temperature, the heat flow, and the strand shell thickness based at least in part on the respective metallurgical solidification model, the metal temperature of the metal being poured, the surface element temperatures, the rotary element shapes, and the characteristic values specifying the metal as such, the die metal temperature, determining the heat flow and the strand shell thickness using a respective heat transfer model modeling heat transfer from the die region into the respective surface elements,
wherein the die metal temperature defines a temperature of the metal located in the die region and adjoining the respective surface element, the heat flow defines a heat flow from metal adjoining the respective surface element into the respective surface element, the strand shell thickness depends on the die metal temperature and the heat flow, and the strand shell thickness is determined in conjunction with the rotational speed of the surface elements, the strand shell thickness defining a respective strand shell thickness forming at the draw-off point;
calculating by the computer the thickness of the metal strip and/or the temperature of the metal strip, the thickness of the metal strip being determined making use of the strip formation model to determine the thickness of the metal strip withdrawn from the die region based on the strand shell thicknesses and the rotary element shapes, and the temperature of the metal strip being determined at the draw-off point based on the die metal temperature;
measuring an actual metal strip thickness;
adapting the heat transfer model based on a comparison of the actual metal strip thickness with the calculated metal strip thickness;
outputting from the computer the thickness of the metal strip and/or the temperature of the metal strip; and
comparing the output from the computer to a setpoint and adjusting operation of the casting device toward the setpoint.

2. The method as claimed in claim 1, wherein the casting model additionally includes a bath model, the computer makes use of the bath model to determine, based on the metal temperature of the metal being poured, for each rotary element, the temperatures of the respective surface elements resulting along the respective rotation path, for each rotary element, the respective rotary element shape in the vicinity of the draw-off point, for each rotary element, the respective enthalpy quantity exchanged per time unit by the respective rotary element with its environment, the characteristic values specifying the metal as such in conjunction with geometric characteristics of the die region, using the heat transfer model, an at least two-dimensionally spatially resolved metal temperature distribution of the metal as a function of location in the die region, and using the metal temperature distribution of the metal, the computer determines the temperature of the metal located in the die region and adjoining the respective surface element.

3. The method as claimed in claim 1, wherein with the respective rotary element model the computer determines, for each rotary element, based on the enthalpy quantity exchanged per time unit by the respective rotary element with its environment, the respective cycle time, and the respective contact time, a rotary element temperature distribution as a function of location at least in a rotary direction and in a depth direction extending orthogonally to a surface of the surface elements, and the computer determines the rotary element shapes taking into account the rotary element temperature distribution.

4. The method as claimed in claim 1, wherein the computer determines the respective rotary element shape by integration of the rotary element temperature distribution in the depth direction.

5. The method as claimed in claim 1, wherein with the respective rotary element model the computer determines not only the heat flow, but also heat contents of the rotary elements themselves.

6. The method as claimed in claim 1, wherein the heat transfer model is a parameterizable heat transfer model that is spatially resolved at least in a strip width direction.

7. The method as claimed in claim 1, further comprising measuring an actual temperature of the metal strip withdrawn from the die region, and adapting the heat transfer model based on a comparison of the actual temperature with the temperature determined by the computer.

8. The method as claimed in claim 1, wherein the computer is supplied with geometric parameters of the casting device as parameters and the computer takes the geometric parameters into account when determining the thickness and/or the temperature of the metal strip.

9. The method as claimed in claim 1, wherein the thickness of the metal strip and/or the temperature of the metal strip are/is compared with a setpoint thickness and/or a setpoint temperature to produce comparison results, and based on the comparison results, at least one correcting variable is determined for a final control device influencing an actual thickness and/or an actual temperature and the final control device is actuated in accordance with the at least one correcting variable.

10. The method as claimed in claim 1, wherein with regard to the metal located in the die region the computer not only differentiates between solid and liquid phases, but also determines an extent of a two-phase region.

11. The method as claimed in claim 10, wherein the computer evaluates the extent of the two-phase region as part of early breakout detection.

\* \* \* \* \*